United States Patent
Kanamura

(10) Patent No.: US 6,946,385 B2
(45) Date of Patent: Sep. 20, 2005

(54) PRODUCTION METHOD FOR SEMICONDUCTOR DEVICE

(75) Inventor: Ryuichi Kanamura, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/489,709

(22) PCT Filed: Jul. 2, 2003

(86) PCT No.: PCT/JP03/08406

§ 371 (c)(1),
(2), (4) Date: Mar. 15, 2004

(87) PCT Pub. No.: WO2004/010495

PCT Pub. Date: Jan. 29, 2004

(65) Prior Publication Data

US 2005/0003653 A1 Jan. 6, 2005

(30) Foreign Application Priority Data

Jul. 19, 2002 (JP) ........................................ 2002-210467

(51) Int. Cl.[7] .......................................... H01L 21/4763
(52) U.S. Cl. ........................ 438/622; 438/673; 438/761
(58) Field of Search ............................... 438/622, 623, 438/627, 640, 671, 673, 717, 761

(56) References Cited

U.S. PATENT DOCUMENTS

| 2001/0002331 A1 | 5/2001 | Miyata |
| 2004/0026364 A1 * | 2/2004 | Kihara et al. ................. 216/20 |

FOREIGN PATENT DOCUMENTS

| JP | 10-143914 | 5/1998 |
| JP | 2000-150519 A | 5/2000 |
| JP | 2001-044189 A | 2/2001 |
| JP | 2001-332619 A | 11/2001 |

OTHER PUBLICATIONS

International Search Report Sep. 24, 2003.

* cited by examiner

Primary Examiner—Phuc T. Dang
(74) Attorney, Agent, or Firm—Rader, Fishman & Grauer PLLC; Ronald P. Kananen

(57) ABSTRACT

Disclosed herein is a production method of a semiconductor device having multilayer interconnections of well-formed dual damascene structure in the low dielectric constant interlayer insulating film.

The method includes a step of forming on an underlayer wiring a first insulating film, a second insulating, and first mask forming layer; a step of forming a first resist mask (20) having an inverted pattern of wiring trenches for the upper wiring; a step of etching the first mask forming layer through the first resist mask, thereby forming in the first mask forming layer a concave part conforming to the inverted pattern of wiring trenches for the upper wiring, and then forming on the first mask forming layer a second mask forming layer, thereby filling the concave part with the second mask forming layer; a step of selectively removing the second mask forming layer on the region in which the wiring trench is formed, thereby forming the second mask having the wiring trench pattern; a step of forming on the first mask forming layer a second resist mask (12) having an opening pattern of the via holes; a step of etching the first mask forming layer and the second insulating film through the second resist mask, thereby forming the via holes. This process is followed by the ordinary procedure to form the dual damascene structure.

11 Claims, 11 Drawing Sheets

PRODUCTION METHOD FOR SEMICONDUCTOR DEVICE

TECHNICAL FIELD

The present invention relates to a production method of a semiconductor device having multilayer interconnections of dual damascene structure in the low dielectric constant interlayer insulating film, and more particularly, to a production method of a semiconductor device having interconnections of dual damascene structure in proper form.

BACKGROUND ART

The ever increasing degree of size reduction and integration in semiconductor devices has posed a serious problem with delay in electric signals resulting from the time constant of interconnections. A solution to this problem is the replacement of aluminum (Al) alloy by copper (Cu) having a lower electric resistance for conductive layers in multilayer interconnection.

Unlike Al, which is a conventional metallic material used for multilayer interconnections, Cu presents difficulties in patterning by dry etching. Consequently, Cu multilayer interconnections are usually obtained by the damascene technique which consists of forming trenches in the insulating film and filling them up with Cu, thereby forming a wiring pattern. It has developed into the dual damascene technique, as disclosed in Japanese Patent Application No. Hei 10-143914, which consists of forming via holes and wiring trenches and filling them up with Cu at the same time. It is attracting attention because it reduces the number of processing steps.

Meanwhile, high-integration semiconductor devices, whose speed decreases as the wiring capacity increases, definitely needs fine multilayer interconnections with low dielectric constant interlayer insulating film for reduction in wiring capacity.

Raw materials for the low dielectric constant interlayer insulating film include fluorine-containing silicon oxide (FSG), having $\varepsilon \approx 3.5$, which has been in practical use, as well as organosilicon polymer, such as polyaryl ether (APE), and inorganic materials, such as hydrogensilsesquioxane (HSQ) and methylsilsesquioxane (MSQ), having $\varepsilon \approx 2.7$. Recently, rendering them porous is being attempted to further reduce their dielectric constant to about 2.2.

For the dual damascene technique to be successfully applied to the low dielectric constant interlayer insulating film, it is necessary to overcome the following technical limitations.

(1) The low dielectric constant film is similar in composition to the resist used for patterning; consequently, it is readily damaged while the resist is being removed. In other words, the low dielectric constant film should be protected from damage that might occur when the resist mask is peeled off after etching or when patterning is repeated because of failure to meet product specifications.

(2) The low dielectric constant film should be applicable to the borderless structure in which there is no margin for alignment of wirings with via holes.

With size reduction of semiconductor devices in the latest generation to realize the design rule of 0.18 $\mu$m, it is essential for multilayer interconnections to be fabricated by a process applicable to the borderless structure. This process should be able to minimize the variation of via hole resistance due to misalignment even in the case where wiring trenches and via holes are formed at the same time by the dual damascene technique in the interlayer dielectric including the low dielectric constant film.

(3) For the wiring trenches to be formed with a well-controlled depth, it is desirable to place an etch stopping film near the bottom of the wiring trench. Unfortunately, an etch stopping film with a comparatively high dielectric constant increases the interlayer capacity if it exists in the interlayer dielectric.

Consequently, there is a demand for the dual damascene technique for the low dielectric constant film which forms the wiring trenches without increase in capacity.

The dual damascene technique which overcomes the above-mentioned technical limitations has been disclosed in Japanese Patent Laid-open Nos. 2000-150519 and 2001-44189.

A description is given below with reference to FIGS. 5A to 5G of the dual damascene technique for the low dielectric constant interlayer film which has been disclosed in Japanese Patent Laid-open No. 2001-44189. FIGS. 5A to 5G are sectional views showing the steps for forming the dual damascene structure according to the conventional process.

As shown in FIG. 5A, an underlying insulating film 1 is deposited on a substrate (not shown). On the underlying insulating film 1 is formed an interlayer insulating film, which is a laminate film consisting of an organic film 2 and a silicon oxide ($SiO_2$) film 3. In the interlayer insulating film is formed buried wiring 4 of copper (Cu) film.

On the buried wiring 4 of Cu film are sequentially formed a silicon carbide (SiC) film 5, which is an anti-oxidizing film for the Cu film, a carbon-containing silicon oxide (SiOC) film 6, which is a methylsilsesquioxane (MSQ) film, and a polyaryl ether (PAE) film 7, which is an organic film.

Further, a silicon oxide ($SiO_2$) film 8, as a first mask forming layer, and a silicon nitride (SiN) film 9, as a second mask forming layer, are sequentially formed. On the SiN film 9 is formed a resist mask 10 with a pattern of wiring trenches.

As shown in FIG. 5B, the SiN film 9 undergoes dry etching through the resist mask 10, so that a second mask 11 of SiN film is formed, which has the pattern of wiring trenches. Then, the resist mask 10 is removed.

A resist mask 12 having the pattern of via holes is formed on the second mask 11 and the $SiO_2$ film 8, in such a way that the resist pattern of via holes overlaps at least partly with the second mask 11 of SiN film having the pattern of wiring trenches.

As shown in FIG. 5C, the SiN film as the second mask 11 and the $SiO_2$ film 8 as the first mask-forming layer undergo dry etching through the resist mask 12 having the pattern of via hole, so that openings are made. Then, the PAE film 7 undergoes etching to form via holes 13 through which the SiOC film 6 is exposed. The resist mask 12 may be removed at the same time as the PAE film 7 is removed by etching.

While openings are being made in the PAE film 7, the resist mask 12 becomes thinner; however, it is still possible to make the via holes 13 in good shape because there remains the first mask 8A of $SiO_2$ film which functions as a mask.

As shown in FIG. 5D, the $SiO_2$ film 6 undergoes etching, so that the via hole 13 is dug down to the SiC film 5 and the via hole 14 is formed. When the via hole 14 has been formed, the $SiO_2$ film 8 constituting the first mask 8A remains in the region where the wiring trench is formed.

This SiO$_2$ film 8 is removed at the same time as etching that uses as a mask the second mask 11 of SiN film having the pattern of wiring trenches. Thus, the opening 15 is formed.

As shown in FIG. 5E, the PAE film 7 remaining on the bottom of the opening 15 undergoes etching, so that the wiring trench 16 is formed. The SiC film 5 remaining on the bottom of the via hole 14 undergoes etching, so that the via hole 14 communicates with the buried wiring 4 of Cu. In this way the wiring trench 16 and the via hole 14 are formed or the processing for dual damascene is completed.

Incidentally, the second mask 11 of SiN film remaining outside the region where the wiring trench is formed is removed when etching is performed on the SiC film 5 remaining on the bottom of the via hole 14.

Next, post treatment with a chemical solution and RF sputtering are carried out to remove etching residues sticking to the side walls of the wiring hole 16 and the via hole 14, and the deteriorated Cu layer in the bottom of the via hole 14 is restored. Then, as shown in FIG. 5F, a Ta film 17 as barrier metal is formed by sputtering. A Cu film 18 is deposited by electrolytic plating or sputtering, so that the wiring trench 16 and the via hole 14 are filled up.

As shown in FIG. 5G, the Ta film 17 and Cu film 18 which have been deposited undergo chemical-mechanical polishing (CMP) so that those parts unnecessary for the wiring pattern are removed. In this way there is obtained the multilayer interconnections of dual damascene structure.

Further, the dual damascene wiring 18 is covered with the SiC film 19 as an anti-oxidizing layer, as in the case of the filled Cu wiring 4 in the lower layer.

The dual damascene technique that employs the double-layer etching mask mentioned above overcomes the above-mentioned technical limitations involved in the low dielectric constant interlayer film.

In other words, even if the resist masks 10 and 12 do not meet the product specifications, their reprocessing can be accomplished on the first mask forming layer 9 or the second mask forming layer 8 and the removal of the resist mask 12 to form the via hole can be accomplished at the same time as the PAE film 7 is etched to form the via hole 13. This makes it possible to peel off the resist while protecting the low dielectric constant film from damage.

Since the via hole 13 (or 14) is made through the second mask 11, which is an SiN film having the wiring pattern, the via hole 14 remains unchanged in dimensions even if there is a misalignment of the wiring trench 16 with the via hole 14.

Moreover, when the wiring trench 16 is formed in the PAE film 7 which has been formed on the SiOC film 6, it is possible to etch them with a desired etching ratio, because the SiOC film 6 is an inorganic MSQ film and the PAE film 7 is an organic polymer film. This makes it possible to easily control the depth of the wiring trench 16 without requiring the etch stopping film, which is an SiN film or the like having a high dielectric constant.

Notwithstanding, the conventional dual damascene technique mentioned above still has the following problems if it is to be applied to the multilayer interconnections according to the latest design rule smaller than 0.1 µm.

The first problem is that the second mask forming layer or the SiN film 9 tends to become thick. The second mask 11 should have a certain thickness because it is used when the via hole 14 is formed by etching the SiOC film (MSQ film) of the via hole interlayer film and the opening 15 is formed in the region where the wiring trench is formed. For example, in the case where the second mask 11 is the SiN film 9 and opening is made in the SiOC film 6 (400 nm thick) which is the via hole interlayer film, the SiN film 9 should have a thickness of 100 to 150 nm in view of the etching selective ratio so that the wiring trench will not widen upward or will not have a round shoulder. The thickening of the second mask forming layer poses the second problem as follows.

The second problem is that the resist mask 12 is often formed on steps and this makes it difficult to accurately form fine patterns.

As shown in FIG. 5B, the SiN film 9 which is the second mask forming layer is etched to form the second mask 11 which has the wiring trench pattern. In this step, the etching selective ratio (SiN/SiO$_2$) is from 2 to 3 at the highest for the SiO$_2$ film 8, which is the first mask forming layer. Therefore, when the SiN film 9 undergoes overetching, the underlying SiO$_2$ film 8 is usually eroded by about 30 nm. Thus, the resist mask 12 which has the via hole pattern has to be formed on a step which is 130 to 180 nm high.

Forming a fine resist pattern conforming to the design rule of 0.10 µm on a step slightly lower than 200 nm is much harder than forming on a flat part because it presents difficulties in line width control and it gives slant pattern bottoms.

The third problem is associated with the coat-type anti-reflection coating (BARC) generally used in lithography. The BARC varies in shape depending on the pattern dimensions and density of the second mask 11 to which it is applied. This leads to variation in depth of focus, which in turn aggravates the shape of resist at the time of exposure and also aggravates the shape of the second mask 11 when the BARC is etched to form the via hole.

The fourth problem is associated with misalignment of the upper layer wiring with the via hole. According to the conventional dual-damascene technique mentioned above, the wiring trench is formed by patterning through the resist mask 10 and then the via hole 13 is formed by patterning through the resist mask 12. Therefore, the mask for the wiring trench 16 is aligned indirectly with the mask for the via hole 14, and alignment in this manner results in a larger displacement of the upper layer wiring from the via hole than the conventional process in which the pattern for the via hole is formed previously.

One way to tackle these problems, which is disclosed in Japanese Patent Laid-open No. 2000-150519, is to form the second mask from a metal film, thereby raising the etch selecting ratio for the MSQ film (the via hole interlayer film), so as to make the second mask thin and reduce the height of steps in the resist.

Unfortunately, a metal film is almost opaque to light of ordinary wavelengths (200 to 1000 nm) used for mask alignment. Therefore, overall coating with a metal film disables alignment by light of ordinary wavelengths or alignment by image processing.

Now, it is an object of the present invention to provide an efficient and high-yield production method of a highly reliable semiconductor device having multilayer interconnections, the method being characterized in forming the dual damascene structure in the low dielectric constant interlayer insulating film composed of PAE film and MSQ film in such a way as to reduce load on resist patterning, thereby giving the dual damascene structure in proper form.

DISCLOSURE OF INVENTION

The present invention has been made to achieve the above-mentioned object. According to the present invention, there is provided a production method of a semiconductor device having an interlayer insulating film including an organic insulating film. The method includes: a step of forming on the interlayer insulating film a first mask as an etching mask which is used when the interlayer insulating film undergoes etching; and a step of forming a second mask as a second etching mask which is used to fabricate the interlayer insulating film and which is made of a material different from that of the first mask and is locally buried in the first mask.

The above-mentioned method according to the present invention represents the requirement constituting the technical core of the present invention. To be concrete, the production method of a semiconductor device according to the present invention (referred to as the first invention) includes:

(a) a step of forming a first insulating film and then forming a second insulating film on the first insulating film, the first insulating film functioning as an insulating film through which penetrate via holes reaching the lower layer wiring formed on the semiconductor substrate, the second insulating film functioning as an insulating film between the upper buried wirings;

(b) a step of forming on the second insulating film a first mask forming layer;

(c) a step of forming on the first mask forming layer a first resist mask having an inverted pattern of wiring trenches for the upper wiring;

(d) a step of etching the first mask forming layer through the first resist mask, thereby forming in the first mask forming layer a concave part conforming to the inverted pattern of wiring trenches for the upper wiring, and then forming on the first mask forming layer a second mask forming layer, thereby filling the concave part with the second mask forming layer;

(e) a step of selectively removing the second mask forming layer on the region in which the wiring trench is formed, such that the second mask forming layer remains in the concave part of the first mask forming layer, thereby forming the second mask having the wiring trench pattern;

(f) a step of forming on the first and second mask forming layers a second resist mask having an opening pattern of the via holes;

(g) a step of etching the second mask, the first mask forming layer, and the second insulating film through the second resist mask as an etching mask, thereby forming the via holes;

(h) a step of etching the first mask forming layer through the second mask as an etching mask, thereby forming the wiring trench in the first mask forming layer, and then etching the first insulating film through the second insulating film as a mask, thereby completing the via holes;

(i) a step of etching the second insulating film through at least either of the first mask and the second mask, thereby forming the wiring trench in the second insulating film; and (j) a step of removing the second mask.

The first invention includes steps (d) and (e). In step (d), the second mask forming layer is formed on the first mask forming layer, such that the concave part is filled up with the second mask forming layer. In the ensuing step (e), the second mask forming layer on the region in which the wiring trench is formed is selectively removed, such that the second mask forming layer remains in the concave part of the first mask forming layer, and the second mask having the wiring trench pattern is formed.

This method produces the following effect. The underlying layer remains flat when the second resist mask having an opening pattern of the via holes is formed. The flat underlying layer permits the second resist mask with an accurate pattern to be formed by ordinary lithography.

The process of the present invention is carried out as follows in its preferred embodiments. In step (a), the first insulating film is a methylsilsesquioxane film and the second insulating film is an organic film. In step (b), the first mask forming layer is an insulating film, and in step (d), the second mask forming layer is a metal film. In step (d), the second mask forming layer is a layer that permits the first mask to be selectively fabricated by reactive ion etching through the second mask. In step (e), the second mask forming layer on the region in which the wiring trench is formed is selectively removed by chemical mechanical polishing.

Another production method of the semiconductor device according to the present invention (referred to as the second invention) includes:

(a) a step of forming a first insulating film and then forming a second insulating film on the first insulating film, the first insulating film functioning as an insulating film through which penetrate via holes reaching the lower layer wiring formed on the semiconductor substrate, the second insulating film functioning as an insulating film between the upper buried wirings;

(b) a step of forming on the second insulating film a first mask forming layer and forming on the first mask forming layer a second mask forming layer;

(c) a step of forming on the second mask forming layer a resist mask having the opening pattern of the wiring trench;

(d) a step of selectively modifying the second mask forming layer through the opening pattern of the wiring trench in the resist mask, thereby forming in the second mask forming layer the second mask having the modified region of the same pattern as the opening pattern of the wiring trench;

(e) a step of forming on the second mask forming layer an etching mask having the opening pattern of the via hole;

(f) a step of etching the second mask, the second mask forming layer, and the first mask forming layer through the etching mask, thereby forming the first mask penetrating the second mask forming layer and the first mask forming layer, and further etching the second insulating film through the first mask as an etching mask, thereby opening the via hole;

(g) a step of performing etching through the second mask, thereby forming the wiring trench in the modified region of the second mask and the first mask forming layer, and at the same time, opening the via hole in the first insulating film by using the second insulating film as a mask;

(h) a step of performing etching through at least either of the first mask and the second mask, thereby forming the wiring trench in the second insulating film; and (i) a step of removing at least the second mask.

The method of the second invention is characterized by step (d) of selectively modifying the second mask forming layer through the opening pattern of the wiring trench in the resist mask, thereby forming in the second mask forming layer the second mask having the modified region of the same pattern as the opening pattern of the wiring trench.

This method produces the following effect. The underlying layer remains flat when the etching mask having an opening pattern of the via holes is formed in step (e). The flat underlying layer permits the etching mask with an accurate pattern to be formed by ordinary lithography.

The method of the present invention is carried out as follows in its preferred embodiments. In step (a), the first insulating film is a methylsilsesquioxane film and the second insulating film is an organic film. In step (b), the second mask forming layer is a layer that permits the first mask to be selectively formed by reactive ion etching through the second mask.

In step (b), the second mask forming layer is a silicon carbide (SiC) film, and in step (d), the second mask forming layer in the wiring trench region is modified by oxygen ion implantation. In step (b), the second mask forming layer is an amorphous silicon (a-Si) film, and in step (d), the second mask forming layer in the wiring trench region is modified by oxygen ion implantation.

The method of the present invention is carried out as follows in its preferred embodiments. In step (d), the second mask forming layer is modified by reactive ion etching through the second mask, so that the modified region of the second mask forming layer is selectively removed, Moreover, in step (d), the second mask forming layer is selectively modified by ion implantation.

BEST MODE FOR CARRYING OUT THE INVENTION

In what follows, the examples of the invention will be described in detail with reference to the accompanying drawings. The examples illustrate the film type, film thickness, film forming method, dimensions, etc. to help understand the invention, and they are not intended to restrict the scope of the invention.

EXAMPLE 1

Figure 1:
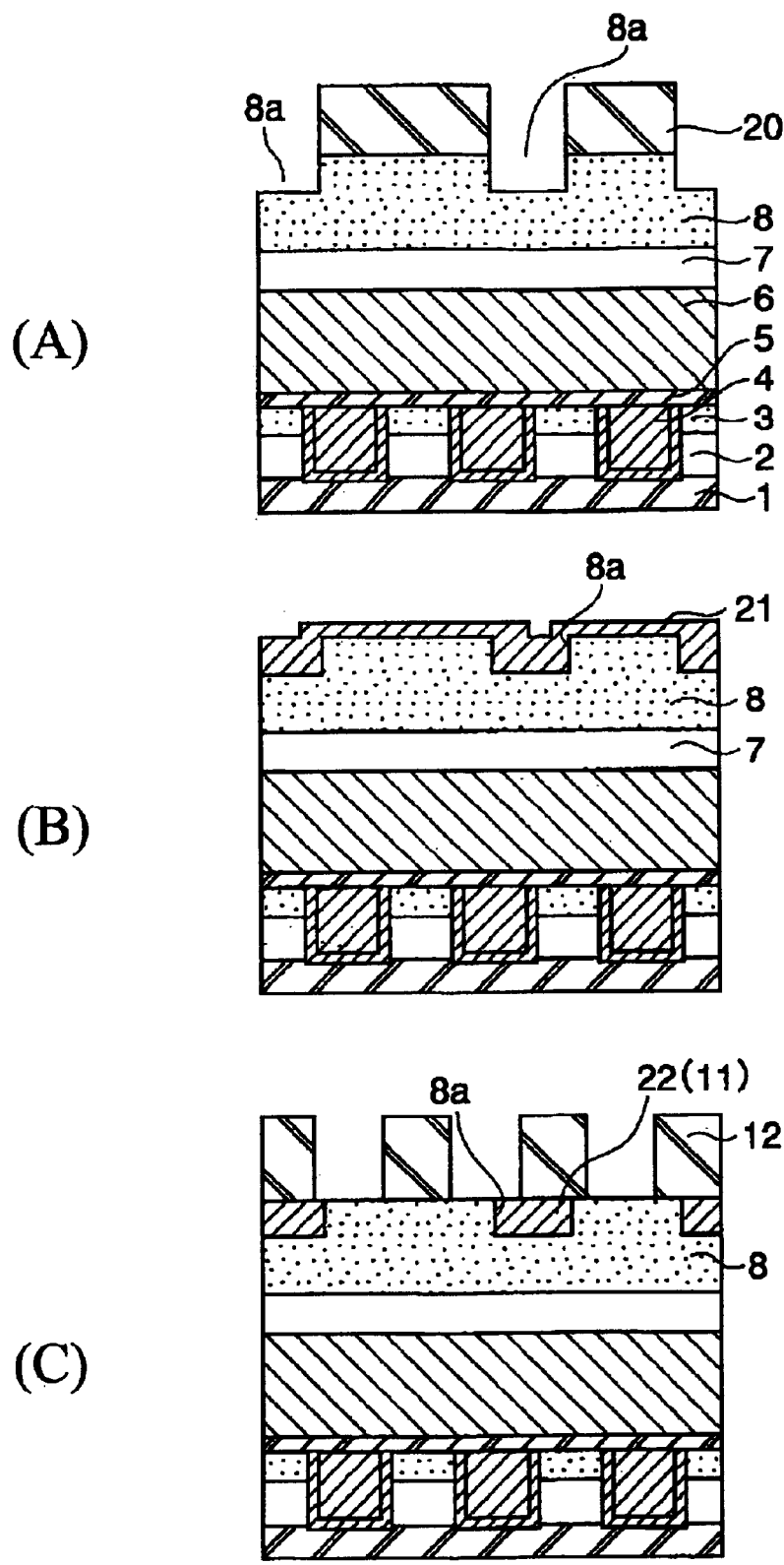
FIGS. 1(A) to 1(C) are sectional views showing the sequential steps of forming the dual damascene structure according to the process in Example 1.

This example demonstrates the production method of a semiconductor device according to the first invention. FIGS. 1 to 2E are sectional views showing the sequential steps of forming the dual damascene structure according to the process in this example. For easy understanding, the same reference numerals are given to the parts in FIGS. 1 to 2E which correspond to the parts in FIGS. 5A to 5G. The same shall apply to FIGS. 3A to 4F.

In the first step shown in (A) of FIG. 1, an underlying insulating film 1 is deposited on a substrate (not shown). On this underlying insulating film 1 is formed an interlayer insulating film which is a laminate film composed of an organic film 2 and a silicon oxide ($SiO_2$) film 3. In this interlayer insulating film is formed a buried wiring 4 of copper (Cu) film which is 250 nm thick.

Then, on the Cu wiring 4 is formed an anti-oxidizing layer which is a 50-nm thick silicon carbide (SiC) film 5. On the anti-oxidizing layer is formed an interlayer insulating film (through which via holes penetrate), which is a 400-nm thick carbon-containing silicon oxide (SiOC) film 6.

The SiC film 5 and SiOC film 6 are formed under the following condition by using a diode parallel plate plasma enhanced CVD system which is supplied with methyl silane as a silicon source gas.

Substrate temperature: 300 to 400° C.
Plasma power: 150 to 350 W
Pressure of atmosphere: 100 to 1000 Pa The thus formed SiC film 5 and SiOC film 6 have a dielectric constant of about 5.0 and 3.0, respectively.

On the SiOC film 6 is formed an organic polymer film 7 having a dielectric constant of about 2.6. In this example, the organic polymer film is a 200-nm thick polyaryl ether (PAE) film 7. The organic polymer film is formed by spin coating with a precursor and subsequent curing at 400 to 450° C.

The PAE film may be substituted with any of BCB film, polyimide film, and amorphous carbon film.

Then, a first mask forming layer is formed, which is a 150-nm thick $SiO_2$ film 8. On the $SiO_2$ film 8 is formed a resist mask 20 which has an inverted pattern of the wiring trenches. Dry etching is performed through the resist mask 20 having the inverted pattern so that an opening 8a is formed which is halfway deep in the $SiO_2$ film 8.

The $SiO_2$ film 8 may be formed by plasma CVD which employs monosilane ($SiH_4$) gas as a silicon source and dinitrogen monoxide ($N_2O$) gas as an oxidizing agent.

If there is possibility of the $SiO_2$ film 8 adversely oxidizing the PAE film 7 thereunder, the $SiO_2$ film 8 should preferably be one which contains more silicon than a stoichiometric amount.

The etching of the $SiO_2$ film 8 through the resist mask 20 may be accomplished by using an ordinary etching apparatus of magnetron type under the following conditions.

Etching gases: octafluorobutane ($C_4F_8$), carbon monoxide (CO), and argon (Ar).
Gas flow rate: $C_4F_8$:CO:Ar=1:5:20
Bias power: 1200 W
Substrate temperature: 20° C.
Etching depth: 100 nm into the $SiO_2$ film 8

In this way the opening 8a (100 nm deep) is formed.

The opening 8a should be formed such that the $SiO_2$ film 8 is etched to a depth of 30 to 200 nm, because it should be thick enough for the second mask to be formed so long as the organic film (PAE film) 7 is not exposed.

The etching of the $SiO_2$ film 8 is followed by ashing with oxygen ($O_2$) plasma and chemical treatment with an organic amine for complete removal of the resist mask 20 and residues remaining after etching.

In the second step shown in (B) of FIG. 1, a second mask forming layer is formed, which is a 150-nm thick tantalum (Ta) film 21, on the $SiO_2$ film 8 having the opening 8a therein.

The Ta film 21 is formed by directional sputtering with a commercial magnetron sputtering apparatus that employs a Ta target.

The second mask forming layer may be a tantalum alloy film (e.g., tantalum nitride (TaN) film), titanium (Ti) film, titanium alloy film, tungsten (W) film, or tungsten alloy film, or a laminate film thereof. It may also be an insulating film, such as silicon carbide (SiC) film and silicon nitride film (SiN), so long as it functions as an etching mask that provides an adequate selective ratio.

The second mask forming layer should preferably be deposited by directional sputtering such as self-discharge ionized sputtering and long-throw sputtering or chemical vapor deposition (CVD), because it should achieve good step coverage on the opening 8a conforming to the inverted pattern of the wiring trench.

The thickness of the second mask forming layer should preferably be larger than 100 nm or larger than the depth of the opening 8a formed in the $SiO_2$ film 8.

Then, the Ta film 21 deposited on the $SiO_2$ film 8 is selectively removed by chemical mechanical polishing (CMP) from the region on the $SiO_2$ film 8 where the wiring trench is formed later. This region corresponds to the interval between adjacent openings 8a. Thus, CMP yields the Ta buried layer 22 in the opening 8a, which constitutes the second mask 11, as shown in (C) of FIG. 1.

CMP to selectively remove the Ta film 21 may be accomplished in an ordinary way with the help of alumina-based slurry, for instance. In this example, CMP is intended to polish not only the Ta film 21 but also the $SiO_2$ film 8 to be exposed to the region in which the wiring trench is formed. The amount of polishing for the $SiO_2$ film 8 is 50 nm. Eventually, there is obtained a Ta buried layer 22 (about 100 nm thick), which is formed in the opening 8a from the Ta film 21 in the region corresponding to the inverted pattern for the wiring trench. This Ta buried layer 22 functions as the second mask 11.

This step may be modified such that the Ta film 21 is 100 nm thick and CMP is carried out to selectively remove the Ta film 21 without polishing the $SiO_2$ film at all. CMP in this manner should not leave residues of the Ta film 22 filling up the opening 8a for any pattern dimension and density.

In the third step shown in (C) of FIG. 1, a resist mask 12 having a via hole pattern is formed on the $SiO_2$ film 8 and the Ta buried layer 22 constituting the second mask 11, in such a way that it overlaps at least partly with the Ta buried layer 22.

This step can be accomplished as adequately as ordinary lithography for the flat surface because, owing to CMP applied to the Ta buried layer 22, there exist very few steps on the surface where the resist mask 12 is formed.

The effect of CMP is also produced in the case where a coat-type anti-reflection coating (BARC) is used. The BARC keeps a uniform shape regardless of the dimension and density of the Ta buried layer 22 constituting the second mask pattern, and the film formed thereon remains stable in thickness. This prevents the resist from becoming poor in shape at the time of exposure and also prevents the variation in the depth of focus which causes the fluctuation of dimensions.

Figure 2A:
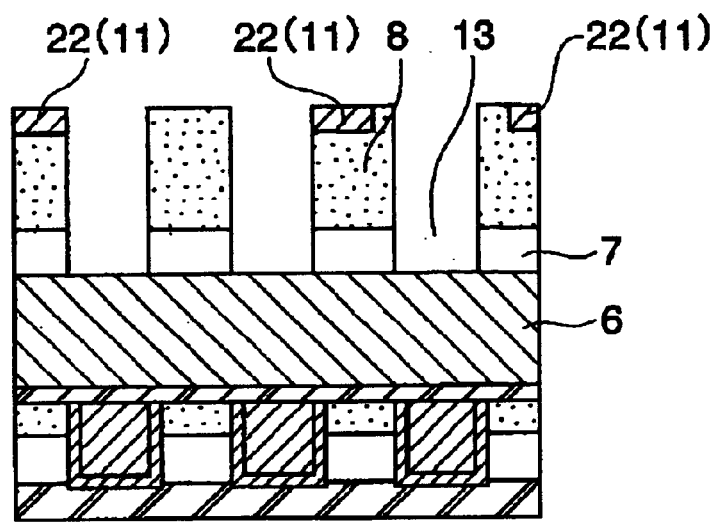
FIGS. 2A to 2E are sectional views showing the sequential steps of forming the dual damascene structure according to the process in Example 1. The step shown in FIG. 2A follows the step shown in FIG. 1(C).

As shown in FIG. 2A, dry etching is performed, through the resist mask 12 having the via hole pattern, on the Ta buried layer 22 remaining in the opening for, the via hole and the $SiO_2$ film 8. Then, etching is performed, through the $SiO_2$ film 8 as the first mask, on the PAE film 7, so as to form the via hole 13 through which the SiOC film 6 exposed. Incidentally, the resist mask 12 may be removed at the same time as the PAE film 7 undergoes etching.

The etched PAE film 7 functions as a mask having the via hole pattern when the SiOC film 6 undergoes etching.

The etching of the Ta buried layer 22 may be accomplished by using an ordinary etching apparatus of magnetron type with octafluorobutane ($C_4F_8$) and oxygen ($O_2$) as etching gases. The dry etching to form the via hole in the $SiO_2$ film 8 may be carried out by using as etching gases octafluorobutane ($C_4F_8$), carbon monoxide (CO), and argon (Ar).

The etching to form the via hole in the PAE film 7 is accomplished by using an ordinary high-density plasma etching apparatus under the following conditions.

Etching gas: ammonia ($NH_4$)
RF power: 150 W
Substrate temperature: 20° C.

Under these conditions, etching proceeds at almost the same rate as in the resist mask 12 and the PAE film 7, so that the resist mask 12 becomes thin while the via hole is being formed in the PAE film 7. However, the Ta buried layer 22 as the second mask or the $SiO_2$ film 8 as the first mask functions as the etching mask, so that the resulting via hole has a good opening shape.

Incidentally, the etching selective ratio of the PAE film 7 to the Ta film, $SiO_2$ film, and SiOC film is greater than 100 under the above-mentioned etching conditions.

Figure 2B:
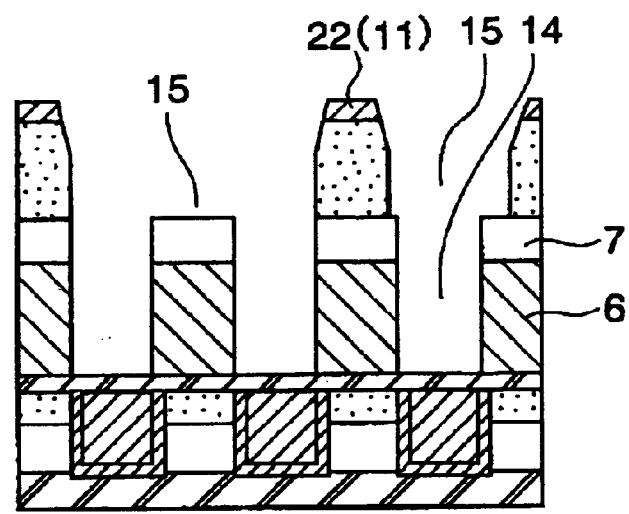

In the fifth step shown in FIG. 2B, dry etching is performed through the Ta buried layer 22 which constitutes the second mask 11 having the wiring trench pattern, thereby forming the wiring trench pattern 15 in the $SiO_2$ film 8 which functions as the first mask.

At the same time as the $SiO_2$ film 8 undergoes etching, the via hole 14 is formed in the SiOC film 6 by etching through the PAE film 7 having the via hole pattern as a mask.

The etching of the $SiO_2$ film 8 and SiOC film 6 is accomplished by using an ordinary etching apparatus of magnetron type under the following conditions.

Etching gases: octafluorocyclopentene ($C_5F_8$), carbon monoxide (CO), argon (Ar), and oxygen ($O_2$)
Gas flow rate: $C_5F_8:CO:Ar:O_2=1:10:5:1$
Bias power: 1600 W
Substrate temperature: 20° C.

Under these etching conditions, the etching selective ratio (SiOC, $SiO_2$/Ta) for the Ta buried layer 22 constituting the second mask 11 is greater than 20. Therefore, the above-mentioned etching adequately forms the opening for the wiring trench without upward widening or shoulder rounding.

Figure 2C:
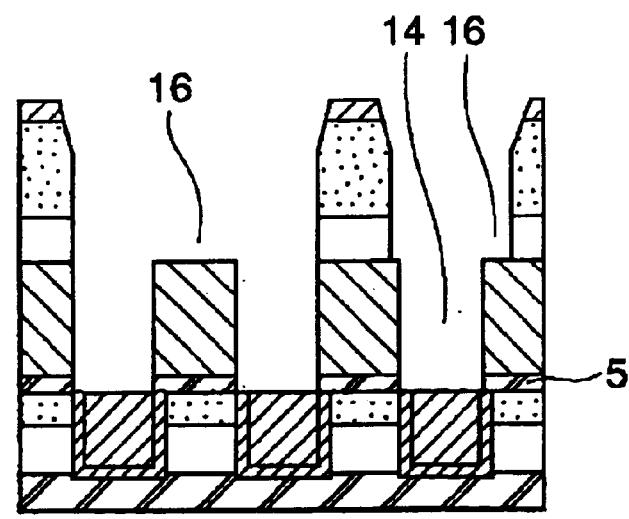

As shown in FIG. 2C, the PAE film 7 remaining at the bottom of the wiring trench undergoes etching, so that the wiring trench 16 is formed. Then the SiC film 5 at the bottom of the via hole undergoes etching, so that the via hole 14 reaches the Cu buried layer 4. Thus the dual damascene procedure is completed.

The etching that is performed on the PAE film 7 to form the wiring trench 16 is accomplished by using an ordinary high-density plasma etching apparatus under the following conditions.

Etching gas: ammonia ($NH_3$)
RF power: 150 W
Substrate temperature: 20° C.

Under these etching conditions, the etching selective ratio of the SiOC film 6 to the Ta film 22 is greater than 100. Therefore, the above-mentioned etching forms the opening for the wiring trench without depth variation under adequate control.

The etching of the SiC film 5 at the bottom of the via hole 14 is accomplished by using an ordinary etching apparatus of magnetron type under the following conditions.

Etching gases: difluoromethane ($CH_2F_2$), oxygen ($O_2$), and argon (Ar)
Gas flow rate: $CH_2F_2:O_2:Ar=2:1:5$
Bias power: 100 W Under these etching conditions, the etching selective ratio for the SiOC film 6 is approximately 1. Therefore, if there is any problem with the etching of the SiOC film 6 at the bottom of the wiring trench 16, it is permissible to perform etching on the SiC film 5 before the wiring trench is formed in the PAE film 7.

Incidentally, the Ta buried layer 22 remaining outside the region where the wiring trench is formed may be removed during etching that is performed on the SiC film 5 at the bottom of the via hole 14. Even though it is not removed in this step, it can be easily removed in the CMP step that is performed on the Cu film and Ta film which are buried later.

Figure 2D:
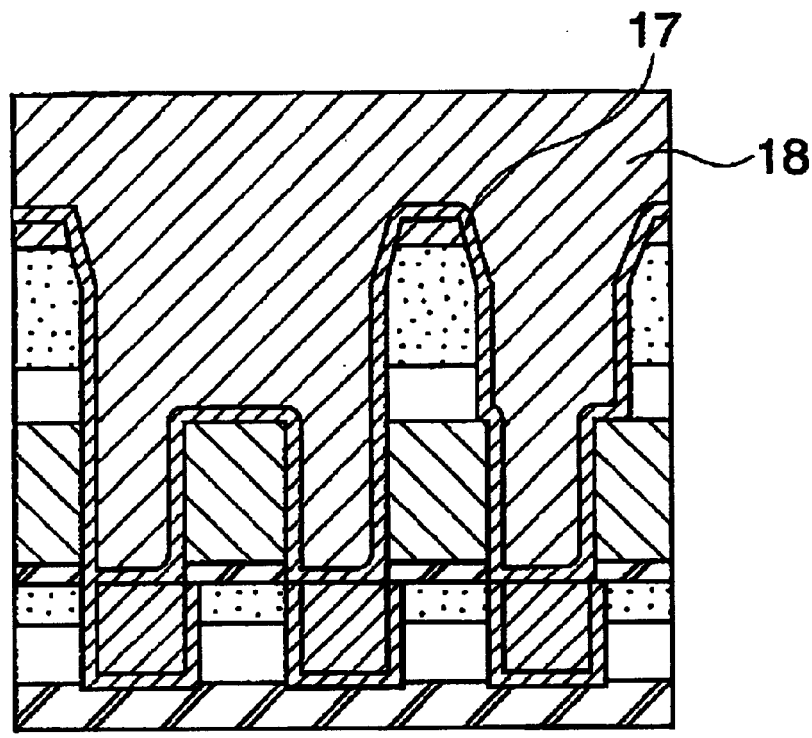
Figure 2E:
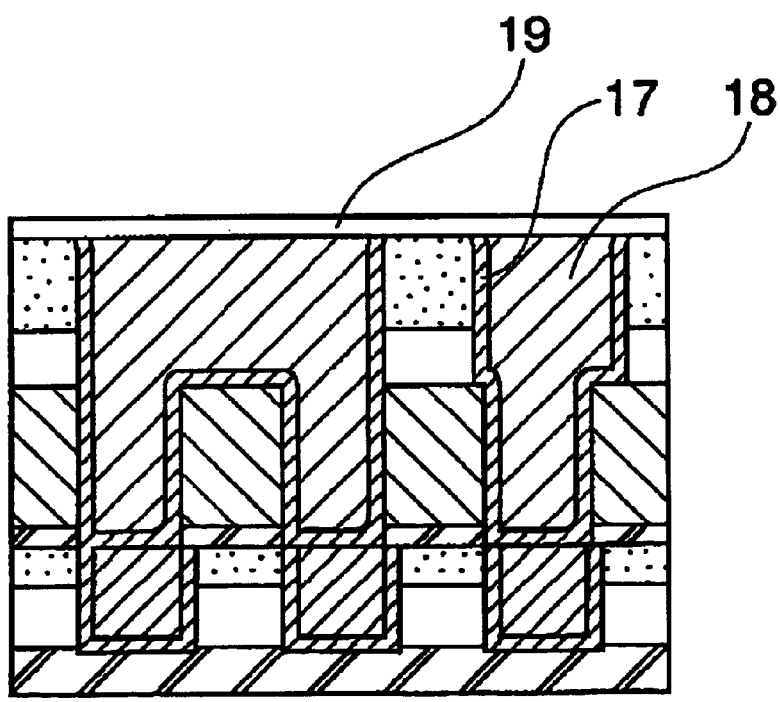

As shown in FIG. 2D, post treatment with a chemical solution and RF sputtering are carried out to remove etching residues sticking to the side walls of the wiring trench 16 and the via hole 14, and the deteriorated Cu layer at the bottom of the via hole 14 is converted into the normal Cu layer. Then, a Ta film 17 as barrier metal is formed by sputtering. A Cu film 18 is deposited by electrolytic plating or sputtering, so that the wiring trench 16 and the via hole 14 are filled up with a conducting film.

As shown in FIG. 2E, the Ta film 17 and the Cu film 18 undergo chemical mechanical polishing (CMP) for removal of their portions unnecessary for the wiring pattern. In this way, there is obtained the multilayer interconnections of dual damascene structure.

In this example, the film for the upper wiring is formed so that it is eventually about 250 nm thick. Also, as in the case of the lower layer wiring pattern, an anti-oxidizing layer (e.g., the SiC film 19) is formed on the dual damascene wiring 18.

This example makes it possible to form the minute opening for the via hole in a stable manner without aggravating the shape of the wiring trench, because no local steps occur on the second mask 11 including the lower Ta buried layer 22 when the resist mask 12 having the via hole pattern is formed and the Ta film 22 as the selectively buried second mask permits etching with a high selective ratio for the via hole 14 to be formed in the SiOC film 6.

For this reason, the multilayer interconnections of dual damascene structure obtained in this example have good via contact characteristics.

Consequently, according to the process of this example, it is possible to produce in high yields the semiconductor device having the dual damascene structure in the low dielectric constant film.

Moreover, the process of this example permits a metal film mask to be used without any problem involved in mask alignment with the underlying pattern even though the metal film mask is nearly opaque to light with a wavelength of 200 to 1000 nm, because the inverted pattern of the wiring trench is formed by using the resist mask 20 before the metal film (Ta film 21) is formed.

Likewise, the Ta buried layer 22 can be formed only in the necessary pattern when the via hole is patterned afterward. Therefore, mask alignment with the lower layer wiring 4 can be accomplished easily if the layer structure is designed such that no metal film remains in the alignment pattern and the alignment measuring pattern.

EXAMPLE 2

This example demonstrates the process for forming the dual damascene structure which is illustrated in section in FIGS. 3A to 3H.

Figure 3A:
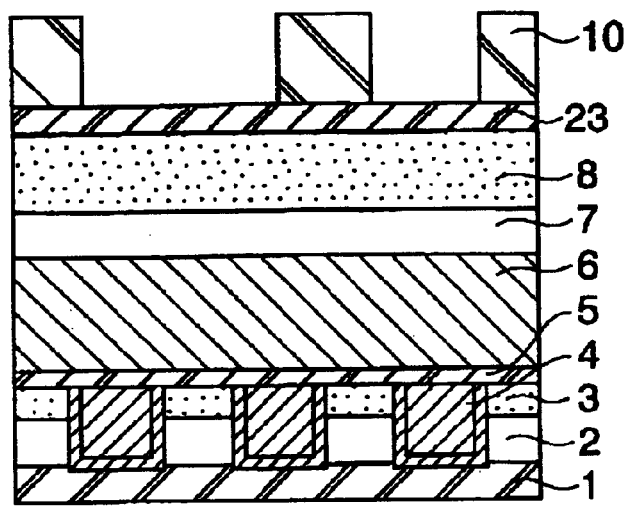
FIGS. 3A to 3H are sectional views showing the sequential steps of forming the dual damascene structure according to the process in Example 2.

As in example 1, the first step shown in FIG. 3A starts with depositing an underlying insulating film 1 on a substrate (not shown). On this underlying insulating film 1 is formed an interlayer insulating film which is a laminate film composed of an organic film 2 and a silicon oxide ($SiO_2$) film 3. In this interlayer insulating film is formed a buried wiring 4 of copper (Cu) film.

Then, on the Cu wiring 4 is formed an anti-oxidizing layer which is a 50-nm thick silicon carbide (SiC) film 5. On the anti-oxidizing layer are formed a carbon-containing silicon oxide (SiOC) film 6 (400 nm thick) and a polyaryl ether (PAE) film 7 (200 nm thick) as an organic polymer layer having a dielectric constant of about 2.6.

Further, on the PAE film 7 is formed a first mask forming layer 8 which is a 150-nm thick $SiO_2$ film.

In this example, a second mask forming layer is formed, which is a 100-nm thick silicon carbide (SiC) film 23.

The silicon carbide (SiC) film 23 as the second mask forming layer is formed under the following conditions by using a diode parallel plate plasma enhanced CVD system.
Silicon source gas: methylsilane
Substrate temperature: 300 to 400° C.
Plasma power: 150 to 350 W
Pressure of atmosphere: 100 to 1000 Pa Then, on the SiC film 23 is formed a resist mask 10 which has a pattern of the wiring trench.

Figure 3B:
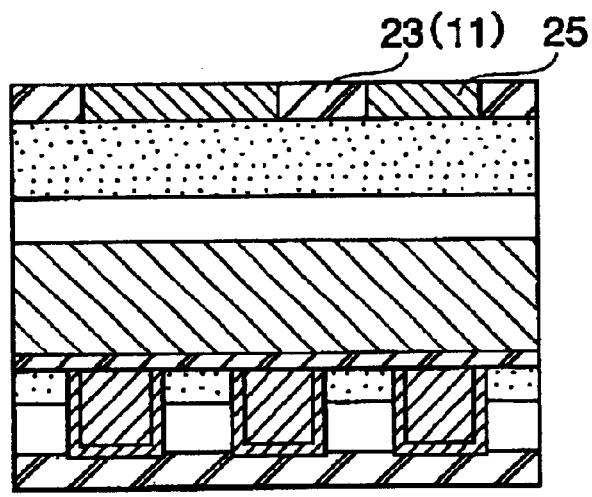

As shown in FIG. 3B, ion implantation is performed, through the resist mask 10, on the SiC film 23 so that the region in which the wiring trench is to be formed is selectively converted into the SiOC region 25. In the region between the adjacent SiOC regions 25 is left the unmodified SiC film 23, which functions as the second mask 11.

Ion implantation may be accomplished by using an ordinary ion implantation system under the following conditions.
Ions to be implanted: oxygen ions ($O^+$)
Accelerating voltage: 50 keV
Dose: $2 \times 10^{18}$ ions/cm$^2$ This ion implantation completely converts the 100-nm thick SiC film 23 in the region where the wiring trench is to be formed into the modified SiOC region 25. If necessary, the ion implantation may be followed by heat treatment below 400° C.

After modification of the SiC film 23 in the region where the wiring trench is to be formed, the resist mask 10 is completely removed by ashing with oxygen ($O_2$) plasma and treatment with a chemical solution capable of dissolving the resist.

There is an alternative method for forming the second mask having the wiring trench pattern by treatment for conversion into insulator. This method consists of forming a silicon nitride (SiN) film as the second mask forming layer and converting its specific region in which the wiring trend is to be formed into SiON by oxygen ion ($O^+$) implantation.

Figure 3C:
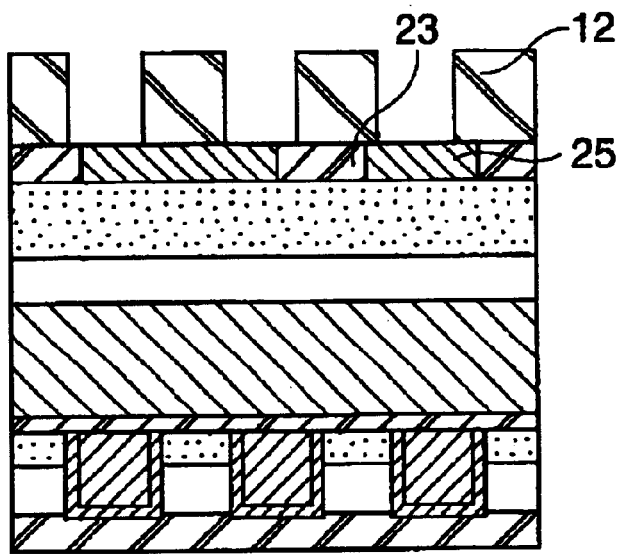

As shown in FIG. 3C, a resist pattern 12 having a via hole pattern is formed on the $SiO_2$ film 8 and the SiC film 23, in such a way that it overlaps at least partly with the unmodified SiC film 23 constituting the wiring trench pattern.

This step can be accomplished as adequately as ordinary lithography for patterning on the flat surface because there exist very few steps on the wiring trench pattern of the SiC film 23 constituting the second mask.

The same effect as mentioned above is also produced in the case where a coat-type anti-reflection coating (BARC) is used. The BARC keeps a uniform shape regardless of the dimension and density of the wiring pattern of the second mask, and the film formed thereon remains stable in thickness. This prevents the resist from becoming poor in shape at the time of exposure and also prevents the variation in the depth of focus which causes the fluctuation of dimensions.

Figure 3D:
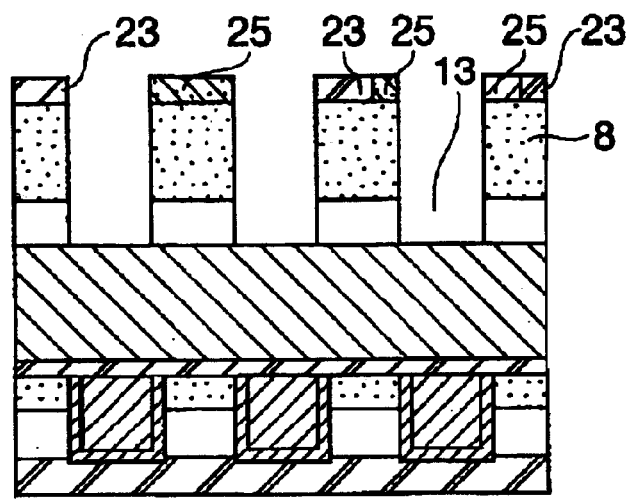

As shown in FIG. 3D, dry etching is performed, through the resist mask 12 having the via hole pattern, on the SiC film 23 and the SiOC modified region 25 both remaining in the opening for the via hole, and the $SiO_2$ film 8 as the first mask forming layer. Then, etching is performed, through the $SiO_2$ film 8 as the first mask, on the PAE film 7, so as to open the via hole 13.

Incidentally, the resist mask. 12 may be removed at the same time as the PAE film 7 undergoes etching.

The etching of the SiC film 23 remaining on the via hole opening may be accomplished by using an ordinary etching apparatus of a magnetron type under the following conditions.

Etching gases: difluoromethane ($CH_2F_2$), oxygen ($O_2$), and argon (Ar)
Gas flow rate: $CH_2F_2:O_2:Ar=2:1:5$
Bias power: 100 W Under these etching conditions, the selective ratio of the SiC film 23 to the SiOC modified region 25 is approximately 1; therefore, both the SiOC region 15 and the SiC film 23 are removed by etching at the same time.

Incidentally, the via hole in the $SiO_2$ film 8 (as the first mask) and the via hole in the PAE film 7 are formed in the same way as the etching of the $SiO_2$ film 8 and the PAE film 7 in Example 1.

Figure 3E:
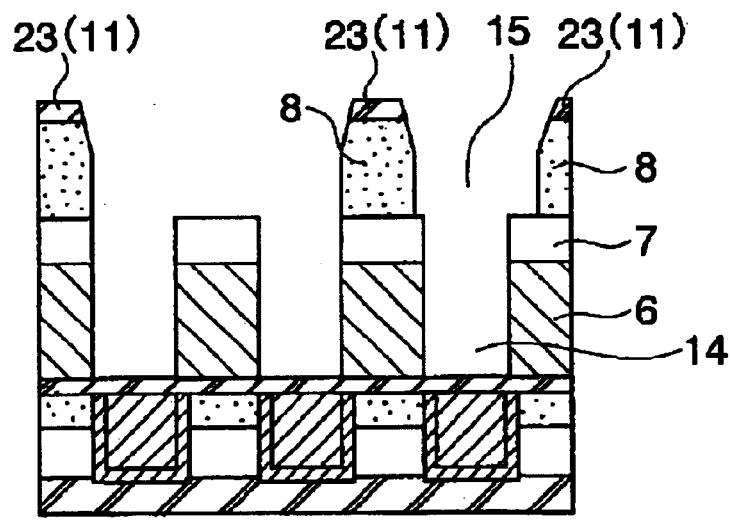

As shown in FIG. 3E, dry etching is performed, through the SiC film 23 which constitutes the second mask 11 having the wiring trench pattern, on the SiOC modified region 25 and the $SiO_2$ film 8 which becomes the first mask, thereby forming the wiring trench pattern 15. At the same time as the wiring trench pattern 15 is formed, etching is performed, through the PAE film 7 in which the via hole pattern has been formed, on the SiOC film 6, thereby forming the via hole 14 through which the SiC film 5 is exposed.

This etching is accomplished by using an ordinary etching apparatus of a magnetron type under the following conditions.

Etching gases: octafluorocyclopentene ($C_5F_8$), carbon monoxide (CO), argon (Ar), and oxygen ($O_2$)
Gas flow rate: $C_5F_8:CO:Ar:O_2=1:10:5:1$
Bias power: 1600 W
Substrate temperature: 20° C.

Under these etching conditions, the etching selective ratio (SiOC, $SiO_2$/SiC) for the SiC film 23 is greater than 15. Therefore, the above-mentioned etching gives the wiring trench pattern 15 with a good opening shape without upward widening or shoulder rounding.

Figure 3F:
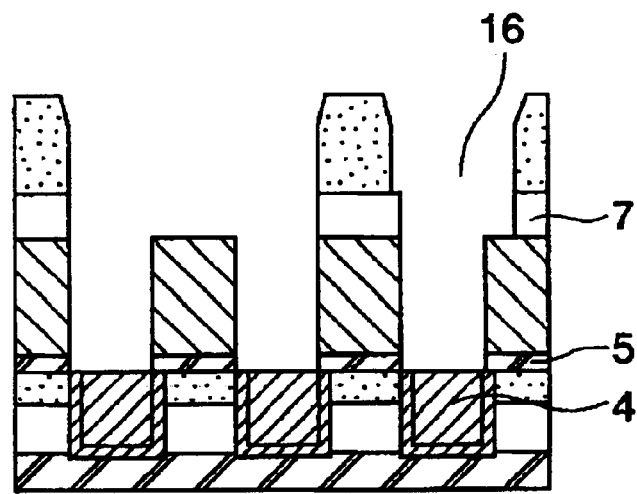

As shown in FIG. 3F, the PAE film 7 remaining at the bottom of the wiring trench pattern 15 undergoes etching, so that the wiring trench 16 is formed. Then the SiC film 5 at the bottom of the via hole 14 undergoes etching, so that the via hole 14 reaches the Cu buried layer 4. Thus the dual damascene procedure is completed.

The etching of the wiring trench 16 in the PAE film 7 and the etching of the SiC film 5 at the bottom of the via hole 14 are carried out in the same way as in Example 1. The remaining SiC film 23 constituting the second mask 11 is removed at the same time as etching is performed on the SiC film 5 at the bottom of the via hole 14.

Figure 3G:
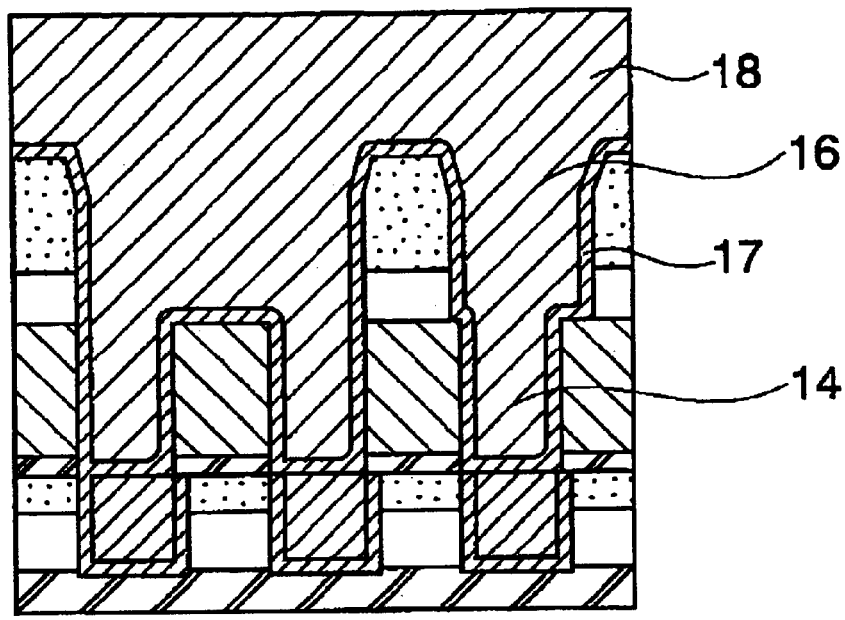

As shown in FIG. 3G, the same procedure as in Example 1 is carried out to remove etching residues sticking to the side walls of the wiring trench 16 and the via hole 14, and the deteriorated Cu layer exposed through the via hole 14 is restored. Then, a Ta film 17 is formed, and a Cu film 18 is deposited by electrolytic plating or sputtering, so that the wiring trench 16 and the via hole 14 are filled up with a conducting film.

Figure 3H:
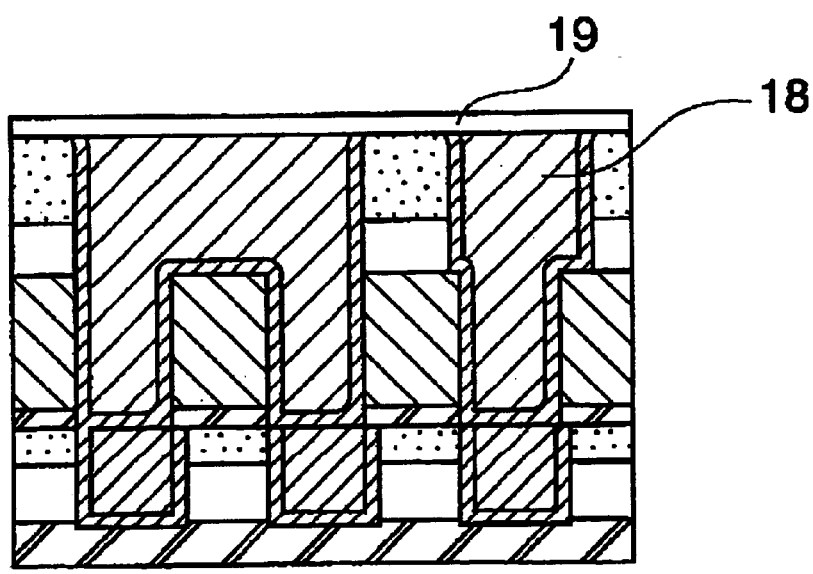

As shown in FIG. 3H, the Ta film 17 and the Cu film 18 undergo chemical mechanical polishing (CMP) for removal of their portions unnecessary for the wiring pattern. Finally, an SiC film 19 is formed on the Cu film 18. In this way, there is obtained the multilayer interconnections of dual damascene structure.

The multilayer interconnections of dual damascene structure fabricated as mentioned above has the same advantage as that obtained in Example 1. That is, the step of forming the resist mask 12 having the via hole pattern does not give rise to local steps on the underlying SiC film 23 and SiOC modified region 25. Moreover, the SiC film 23 which has been selectively buried and formed and which constitutes the second mask permits etching with a high selective ratio to be carried out to form the via hole 14 in the SiOC film 6. Thus, this example makes it possible to form the minute opening for the via hole in a stable manner without aggravating the shape of the wiring trench.

For this reason, the multilayer interconnections of dual damascene structure obtained in this example has good via contact characteristics. Consequently, according to the process of this example, it is possible to produce in high yields the semiconductor device having the dual damascene structure in the low dielectric constant interlayer insulating film.

EXAMPLE 3

This example demonstrates the process for forming the dual damascene structure which is illustrated in section in FIGS. 4A to 4F.

Figure 4A:
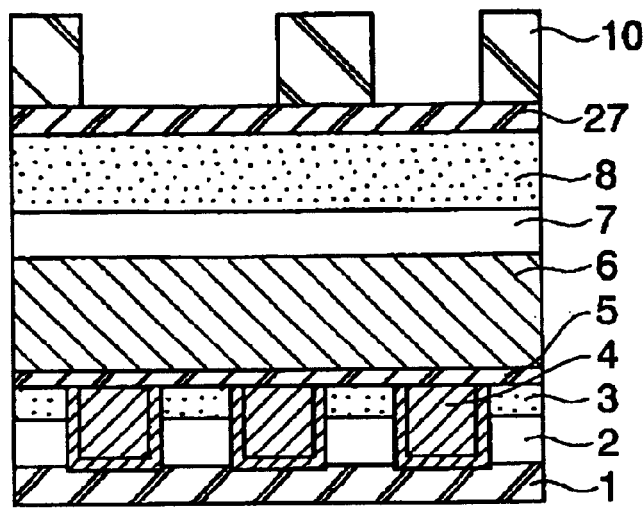
FIGS. 4A to 4F are sectional views showing the sequential steps of forming the dual damascene structure according to the process in Example 3.

As in example 1, the first step shown in FIG. 4A starts with depositing an underlying insulating film 1 on a substrate (not shown). On this underlying insulating film 1 is formed an interlayer insulating film which is a laminate film composed of an organic film 2 and a silicon oxide ($SiO_2$) film 3. In this interlayer insulating film is formed a buried wiring 4 of copper (Cu) film.

Then, on the Cu wiring 4 is formed an anti-oxidizing layer which is a 50-nm thick silicon carbide (SiC) film 5. On the anti-oxidizing layer are formed a carbon-containing silicon oxide (SiOC) film 6 (400 nm thick) and a polyaryl ether (PAE) film 7 (200 nm thick) as an organic polymer layer having a dielectric constant of about 2.6.

Further, on the PAE film 7 is formed a first mask forming layer 8 which is a 150-nm thick $SiO_2$ film.

In this example, a second mask forming layer, which is a 50-nm thick amorphous silicon (a-Si) film 27, is formed by argon plasma sputtering with a silicon target.

Then, on the a-Si film 27 is formed a resist mask 10 which has a pattern of the wiring trench.

Figure 4B:
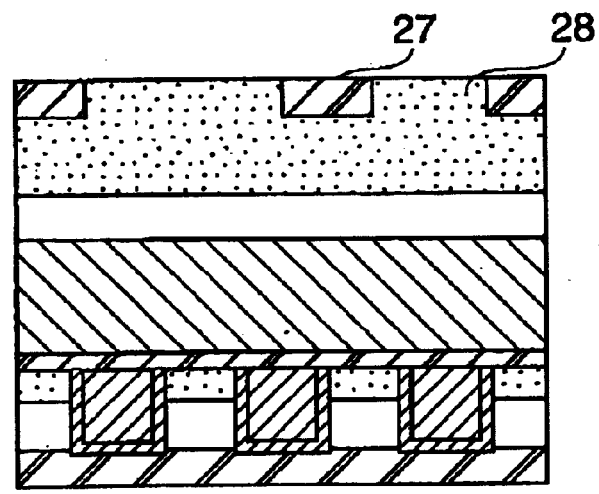

As shown in FIG. 4B, ion implantation is performed, through the resist mask 10, on the a-Si film 27 so that the region in which the wiring trench is to be formed is selectively converted into the modified region 28 of $SiO_2$, which appears between the adjacent regions of a-Si film 27 remaining unmodified.

Ion implantation may be accomplished by using an ordinary ion implantation system under the following conditions.

Ions to be implanted: oxygen ions ($O^+$)
Accelerating voltage: 20 keV
Dose: $2\times10^{18}$ ions/cm$^2$ This ion implantation completely converts the 50-nm thick a-Si film 27 into the region of $SiO_2$ film 28. If necessary, the ion implantation may be followed by heat treatment below 400° C.

After modification of the a-Si film in the region where the wiring trench is to be formed, the resist mask 10 is completely removed by ashing with oxygen ($O_2$) plasma and treatment with a chemical solution capable of dissolving the resist.

There is an alternative method for forming the second mask by treatment for conversion into an insulator. This method consists of implanting carbon ions ($C^+$) into the a-Si film 27, thereby converting it into SiC, or implanting nitrogen ions ($N^+$) into the a-Si film 27, thereby converting it into SiN. In any case, conversion should be carried out such that the composition after modification is close to that of the first mask forming layer lying thereunder. This facilitates later fabrication.

Figure 4C:
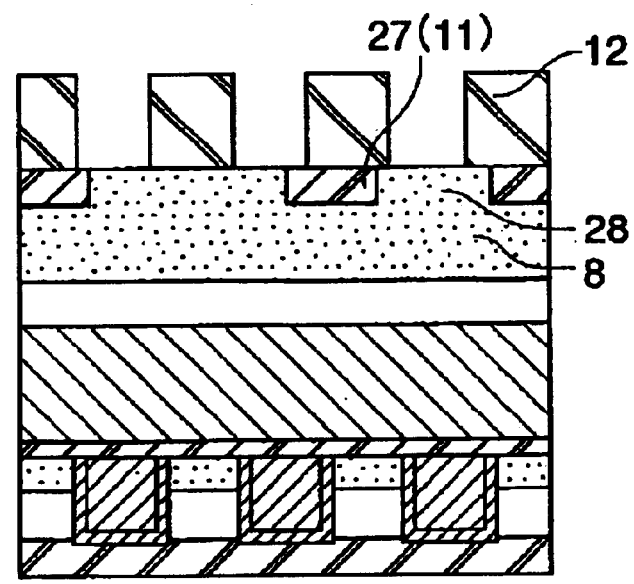

As shown in FIG. 4C, a resist mask 12 having a via hole pattern is formed in such a way that it overlaps at least partly with the unmodified region of a-Si film 27 as the second mask 11 constituting the wiring trench pattern.

This step can be accomplished as adequately as ordinary lithography for patterning on the flat surface because there exist very few steps on the unmodified region of a-Si film 27 as the second mask 11. This makes it possible to form a good resist pattern for via holes.

The same effect as mentioned above is also produced in the case where a coat-type anti-reflection coating (BARC) is used. The BARC keeps a uniform shape regardless of the dimension and density of the wiring pattern (unmodified region of a-Si film 27) of the second mask 11, and the film formed thereon remains stable in thickness. This prevents the resist from becoming poor in shape at the time of exposure and also prevents the variation in the depth of focus which causes the fluctuation of dimensions.

Figure 4D:
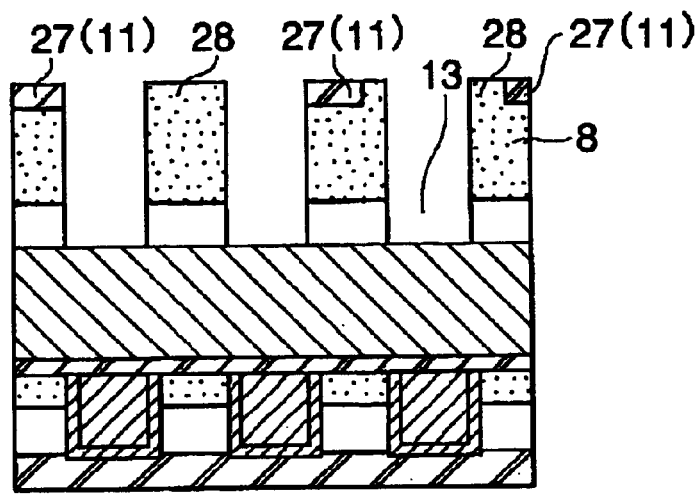

As shown in FIG. 4D, dry etching is performed, through the resist mask 12 having the via hole pattern, on the a-Si film 27 as the second mask and the $SiO_2$ modified region 28 both remaining in the opening for the via hole, and the $SiO_2$ film 8 as the first mask forming layer. Then, etching is performed, through the $SiO_2$ film 8 as the first mask, on the PAE film 7, so as to form the via hole 13. Incidentally, the resist mask 12 may be removed at the same time as the PAE film 7 undergoes etching.

The etching of the a-Si film 27 as the second mask 11 may be accomplished by using an ordinary plasma etching apparatus under the following conditions.

Etching gases: chlorine ($Cl_2$), hydrogen bromide (HBr), and oxygen ($O_2$)
Gas flow rate: $Cl_2$:HBr:$O_2$=10:2:1
RF power: 20 W
Substrate temperature: 0° C.

The procedure for making the via hole 13 in the $SiO_2$ modified region 28 and the $SiO_2$ film as the first mask is identical with that for making the via hole in the $SiO_2$ film 8 as the first mask in Example 1.

The via hole in the PAE film 7 is also made in the same way as in Example 1. Under these etching conditions, the etching rate of the resist mask 12 is approximately equal to that of the PAE film 7; therefore, the resist mask 12 becomes thin as etching on the PAE film 7 proceeds. Nevertheless, it is possible to form the via hole 13 with a good shape by using the a-Si film 27 which is the second mask or the $SiO_2$ film 8 which is the first mask as the etching mask. Incidentally, the etching selective ratio of the PAE film 7 to the a-Si film, $SiO_2$ film, and SiOC film is greater than 100.

Figure 4E:
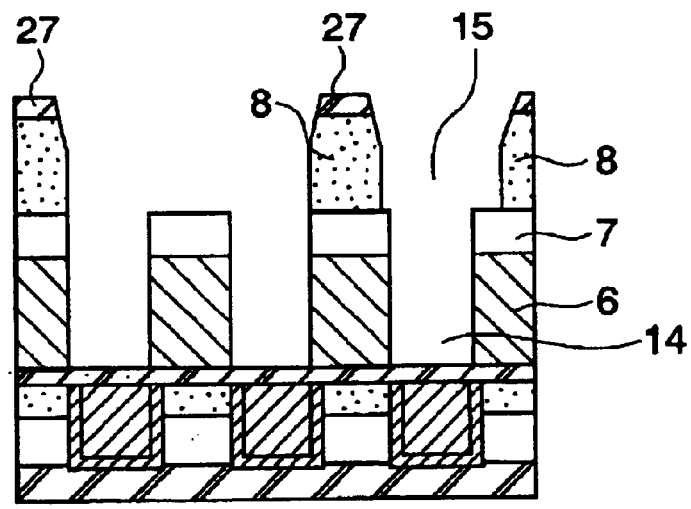

As shown in FIG. 4E, dry etching is performed, through the-a-Si film 27 which constitutes the second mask having the wiring trench pattern, on the $SiO_2$ modified region 28 and the $SiO_2$ film 8 which becomes the first mask, thereby forming the wiring trench pattern 15.

As in Example 1, at the same time as the wiring trench pattern 15 is formed, etching is performed, through the PAE film 7 having the via hole 13 formed therein, on the SiOC film 6, thereby forming the via hole 14. Under the condition of this etching, the etching selective ratio (SiOC, $SiO_2$/SiC) for the a-Si film 27 is greater than 20. Therefore, the above-mentioned etching gives the wiring trench pattern 15 with a good opening shape without upward widening or shoulder rounding.

Figure 4F:
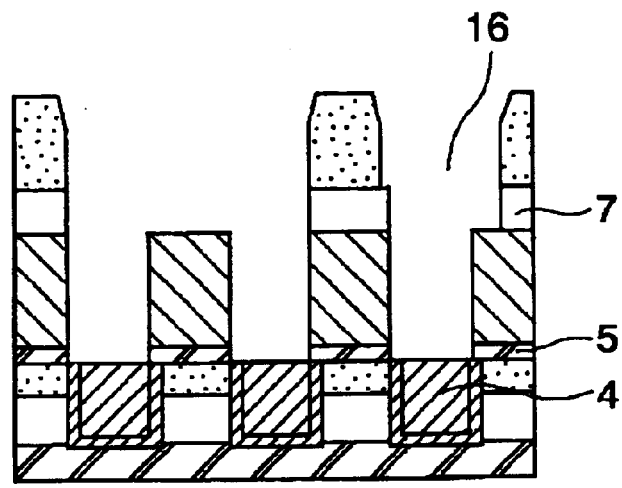
Figure 5A:
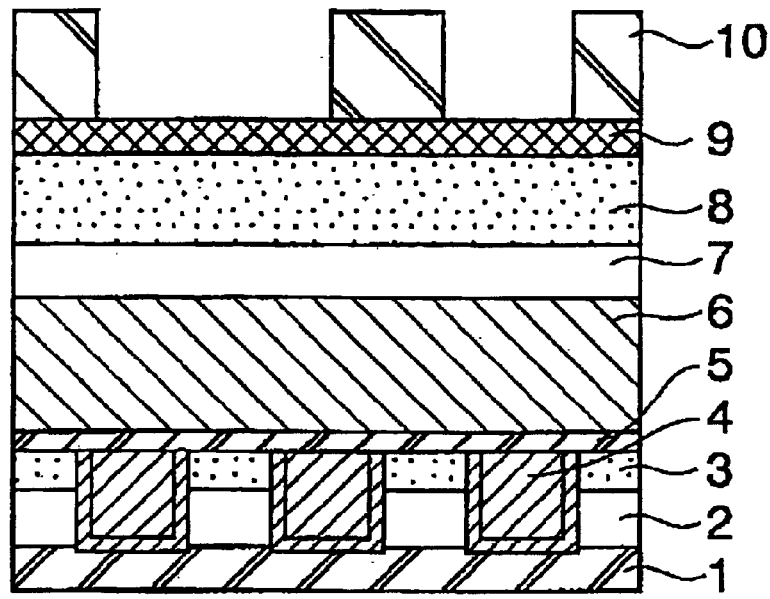
FIGS. 5A to 5G are sectional views showing the sequential steps of forming the dual damascene structure according to the conventional process.
Figure 5B:
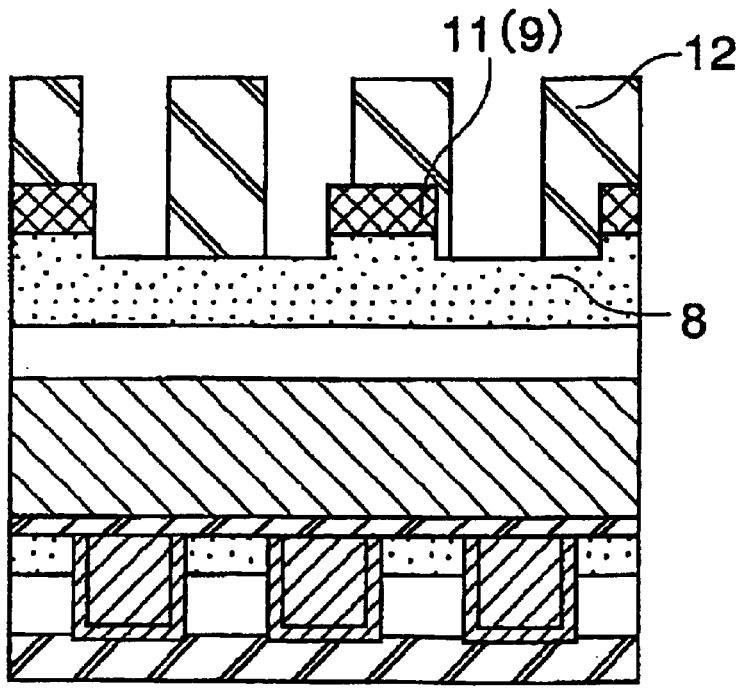
Figure 5C:
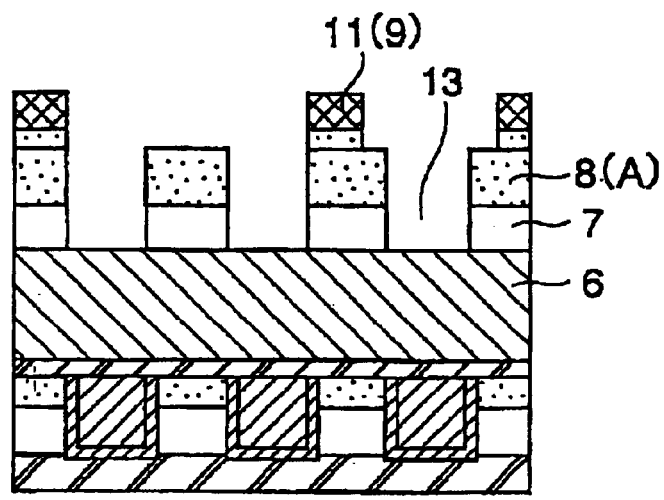
Figure 5D:
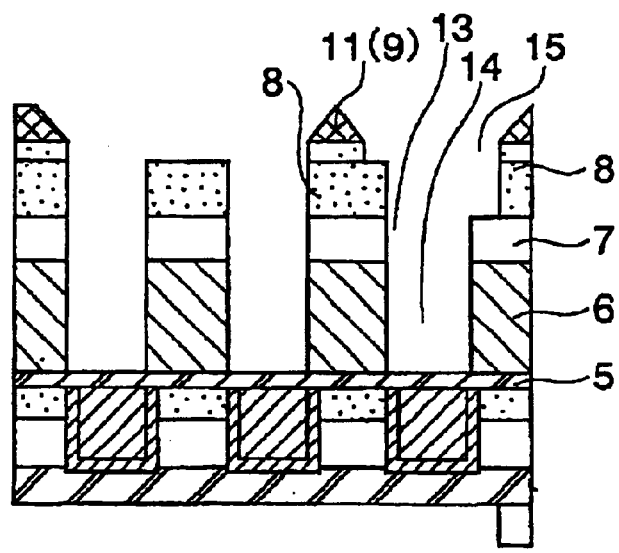
Figure 5E:
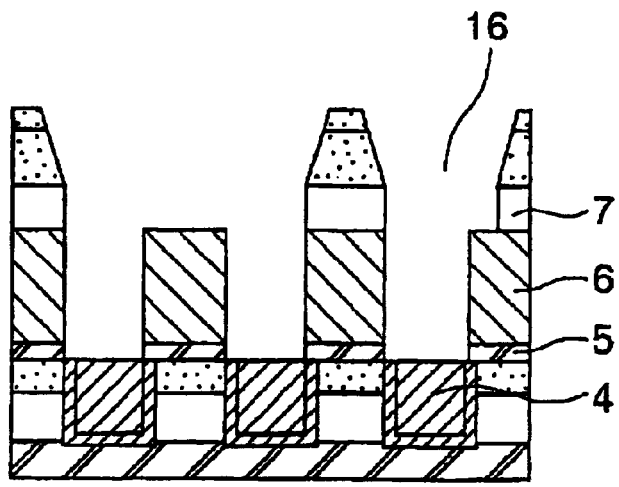
Figure 5F:
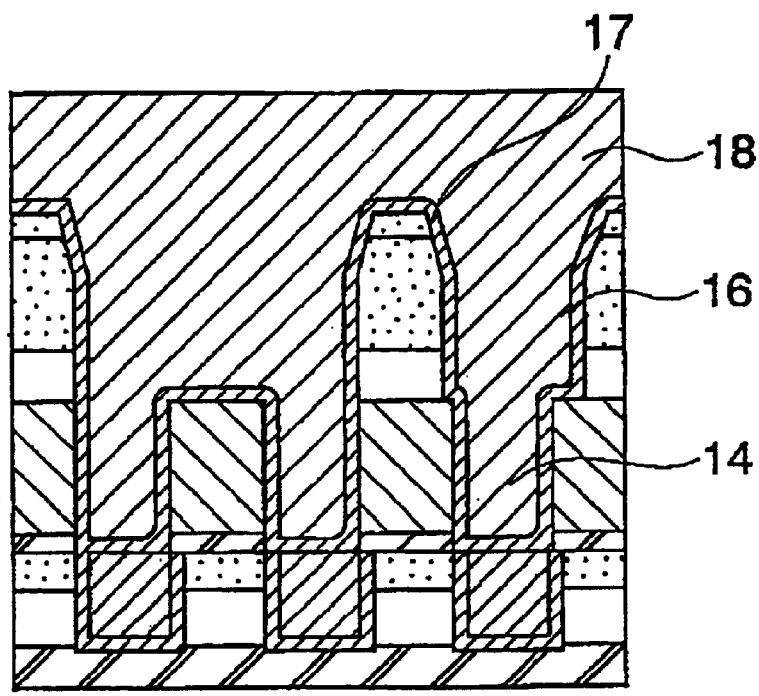
Figure 5G:
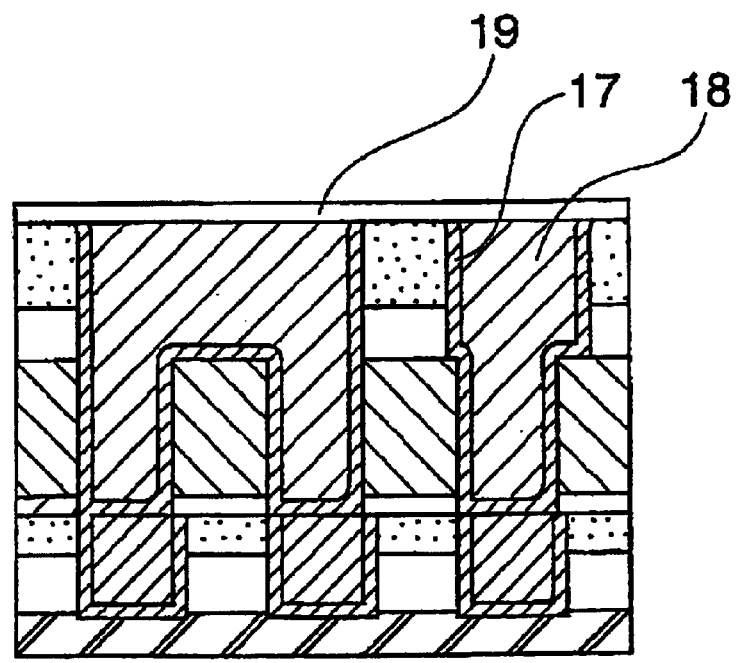

As shown in FIG. 4F, the PAE film 7 remaining at the bottom of the wiring trench pattern 15 undergoes etching, so that the wiring trench 16 is formed. Then the SiC film 5 at the bottom of the via hole 14 undergoes etching, so that the via hole 14 reaches the Cu buried layer 4. Thus the dual damascene procedure is completed.

Following the above-mentioned steps, the multilayer interconnections of dual damascene structure is obtained by the same procedure as in Example 2 (not shown).

Incidentally, the a-Si film 27 as the second mask remaining outside the region of the wiring trench can be removed during etching on the SiC film 5 at the bottom of the via hole. Even if it cannot be removed by this step, it can be easily removed in the CMP process for the Cu film and Ta film to be filled later.

The process for fabricating the multilayer interconnections of dual damascene structure does not give local steps on the underlying layer when the resist mask 12 having the via hole pattern is formed. This makes it possible to accurately form the resist mask 12 having a minute pattern.

The a-Si film 27 constituting the second mask 11, which is selectively formed by filling, permits etching with a high selective ratio when the via hole 14 is formed in the SiOC film 6. Thus, this example makes it possible to form the minute opening for the via hole in a stable manner without aggravating the shape of the wiring trench. This leads to good via contact characteristics.

According to the process of this example, it is possible to produce in high yields the semiconductor device having the dual damascene structure in the low dielectric constant interlayer insulating film.

In Examples 1 to 3, the interlayer insulating film is not restricted to the kind of film, thickness of film, and the film forming method mentioned therein. For instance, the SiC film 5 or 19, which is the anti-oxidizing layer for the Cu film, may be replaced by an SiN film to be formed by CVD method, or the SiC film may contain such light elements as nitrogen ($N_2$) and hydrogen (H).

The laminate structure composed of the SiOC film 6 which is the interlayer film for the via hole and the PAE film 7 which is the interlayer film for the wiring may be the one in which the SiOC film is replaced by SiOF film or $SiO_2$ film formed by CVD or MSQ film or HSQ film formed by spin coating, and the PAE film is replaced by a polyarylene ether film, amorphous carbon film, or polytetrafluoroethylene film. Moreover, the PAE film may be replaced by xerogel film, porous MSQ film, or organic polymer film, or a combination thereof.

In Examples 1 to 3, the $SiO_2$ film 8 as the first mask which is formed on the PAE film and MSQ film eventually remains as the interconnection layer (about 50 nm thick) as shown in FIG. 2D; however, the first mask may be replaced by an inorganic low dielectric constant film such as SiOF film, MSQ film and HSQ film, unless it poses problems with adhesion to barrier metal, mechanical strength in the Cu-CMP process, or damage resulting from the reduction of Cu oxide which is carried out before the anti-oxidizing layer 19 for Cu is formed.

Similarly, so long as the foregoing condition is satisfied, the first mask may be removed in the dual damascene etching step or the Cu-CMP step.

In Example 2, the SiC film 23 as the second mask forming layer is selectively modified by oxygen ion implantation so that the SiC film 23 outside the mask region is oxidized.

However, this method is not restrictive. It is possible to use a combination of two or more methods of modification that allows different selective ratios for the ensuing etching and permits the second mask to selectively remove the insulating film of the first mask forming layer and the interlayer insulating film for the via hole. Such an alternative method may consist of depositing an SiOC film as the second mask forming layer on the entire surface and performing ion implantation with an inert gas, such as argon (Ar) and helium (He), through the mask having an inverted pattern of the wiring trench, on the SiOC film as the second mask forming layer outside the region where the wiring trench is formed, thereby severing the Si—O bond and converting the second mask into SiC.

In Example 3, the selective ion implantation into the a-Si film 27 to form the second mask 11 is accomplished in such a way that the a-Si film outside the mask region is converted into an insulator. However, this method is not restrictive. It is possible to use a combination of two or more methods of modification that allows different selective ratios for the ensuing etching and permits the second mask to selectively remove the insulating film of the first mask forming layer and the interlayer insulating film for the via hole. Such an alternative method may consist of depositing an a-Si film as the second mask forming layer on the entire surface and performing ion implantation with nitrogen ions or carbon ions on the a-Si film outside the region for the wiring trench through the mask having an inverted pattern of the wiring trench, thereby converting the second mask into an SiN mask or SiC mask.

INDUSTRIAL APPLICABILITY

According to the present invention, it is possible to produce a semiconductor device having multilayer interconnections of dual damascene structure in the low dielectric constant film in such a way that the etching mask for the wiring trench is formed with no local steps occurring. This makes it possible to form the wiring trench and via hole with accurate alignment and high precision.

Moreover, the method of the present invention permits a metal film to be used as a mask material. The use of a metal film has been restricted from the standpoint of mask alignment. This leads to the good structure of dual damascene.

The method of the present invention permits the efficient production of highly integrated, greatly miniaturized high-performance semiconductor devices with multilayer interconnections of dual damascene structure.

What is claimed is:

1. A production method of a semiconductor device comprising:
    (a) a step of forming a first insulating film and then forming a second insulating film on said first insulating film, said first insulating film functioning as an insulating film through which penetrate via holes reaching the lower layer wiring formed on the semiconductor substrate, said second insulating film functioning as an insulating film between the upper buried wirings;
    (b) a step of forming on the second insulating film a first mask forming layer;
    (c) a step of forming on the first mask forming layer a first resist mask having an inverted pattern of wiring trenches for the upper wiring;
    (d) a step of etching the first mask forming layer through the first resist mask, thereby forming in the first mask forming layer a concave part conforming to the inverted pattern of wiring trenches for the upper wiring, and then forming on the first mask forming layer a second mask forming layer, thereby filling the concave part with the second mask forming layer;
    (e) a step of selectively removing the second mask forming layer on the region in which the wiring trench is formed, such that the second mask forming layer remains in the concave part of the first mask forming layer, thereby forming the second mask having the wiring trench pattern;
    (f) a step of forming on the first and second mask forming layers a second resist mask having an opening pattern of the via holes;
    (g) a step of etching the second mask, the first mask forming layer, and the second insulating film through the second resist mask as an etching mask, thereby opening the via holes;
    (h) a step of etching the first mask forming layer through the second mask as an etching mask, thereby forming the wiring trench in the first mask forming layer, and then etching the first insulating film through the second insulating film as a mask, thereby completing the via holes;
    (i) a step of etching the second insulating film through at least either of the first mask and the second mask, thereby forming the wiring trench in the second insulating film; and
    (j) a step of removing the second mask.

2. The production method of a semiconductor device as defined in claim 1, wherein, in step (a), the first insulating film is a methylsilsesquioxane film and the second insulating film is an organic film.

3. The production method of a semiconductor device as defined in claim 1, wherein, in step (b), the first mask forming layer is an insulating film, and in step (d), the second mask forming layer is a metal film.

4. The production method of a semiconductor device as defined in claim 1, wherein, in step (d), the second mask forming layer is a layer that permits the first mask to be selectively fabricated by reactive ion etching through the second mask.

5. The production method of a semiconductor device as defined in claim 1, wherein, in step (e), the second mask forming layer on the region in which the wiring trench is formed is selectively removed by chemical mechanical polishing (CMP).

6. A production method of a semiconductor device which comprising:
    (a) a step of forming a first insulating film and then forming a second insulating film on said first insulating film, said first insulating film functioning as an insulating film through which penetrate via holes reaching the lower layer wiring formed on the semiconductor substrate, said second insulating film functioning as an insulating film between the upper buried wirings;
    (b) a step of forming on the second insulating film a first mask forming layer and forming on the first mask forming layer a second mask forming layer;
    (c) a step of forming on the second mask forming layer a resist mask having the opening pattern of the wiring trench;
    (d) a step of selectively modifying the second mask forming layer through the opening pattern of the wiring trench in the resist mask, thereby forming in the second mask forming layer the second mask having the modified region of the same pattern as the opening pattern of the wiring trench;
    (e) a step of forming on the second mask forming layer an etching mask having the opening pattern of the via hole;

(f) a step of etching the second mask, the second mask forming layer, and the first mask forming layer through the etching mask, thereby forming the first mask penetrating the second mask forming layer and the first mask forming layer, and further etching the second insulating film through the first mask as an etching mask, thereby forming the via hole;

(g) a step of performing etching through the second mask, thereby forming the wiring trench in the modified region of the second mask and the first mask forming layer, and at the same time, forming the via hole in the first insulating film by using the second insulating film as a mask;

(h) a step of performing etching through at least either of the first mask and the second mask, thereby forming the wiring trench in the second insulating film; and (i) a step of removing at least the second mask.

7. The production method of a semiconductor device as defined in claim 6, wherein, in step (a), the first insulating film is a methylsilsesquioxane film and the second insulating film is an organic film.

8. The production method of a semiconductor device as defined in claim 6, wherein, in step (b), the second mask forming layer is a layer that permits the first mask to be selectively formed by reactive ion etching through the second mask.

9. The production method of a semiconductor device as defined in claim 6, wherein, in step (d), the second mask forming layer is selectively modified by ion implantation.

10. The production method of a semiconductor device as defined in claim 6, wherein, in step (b), the second mask forming layer is a silicon carbide (SiC) film, and in step (d), the second mask forming layer in the wiring trench region is modified by oxygen ion implantation.

11. The production method of a semiconductor device as defined in claim 6, wherein, in step (b), the second mask forming layer is an amorphous silicon (a-Si) film, and in step (d), the second mask forming layer in the wiring trench region is modified by oxygen ion implantation.

* * * * *